United States Patent [19]
Furutani et al.

[11] Patent Number: 5,268,654
[45] Date of Patent: Dec. 7, 1993

[54] PHASE LOCKED LOOP CLOCK CHANGEOVER APPARATUS IN WHICH THE VCO IS SET TO AN INITIAL VALUE

[75] Inventors: Tadashige Furutani, Kadoma; Mayumi Hironaka; Chikashi Inokuchi, both of Katano; Kenzo Ishibashi, Moriguchi, all of Japan

[73] Assignee: Matsushita Electric Industrial Co., Ltd., Osaka, Japan

[21] Appl. No.: 920,097

[22] Filed: Jul. 24, 1992

[30] Foreign Application Priority Data

Jul. 24, 1991 [JP] Japan ................................. 3-184527

[51] Int. Cl.⁵ .............................................. H03L 7/18
[52] U.S. Cl. .......................................... 331/10; 331/14; 331/16; 331/25
[58] Field of Search ..................... 331/10, 11, 14, 16, 331/25

[56] References Cited

U.S. PATENT DOCUMENTS

| 4,105,948 | 8/1978 | Wolkstein | 331/14 |
| 4,437,072 | 3/1984 | Asami | 331/1 A |
| 4,951,005 | 8/1990 | Babin | 331/16 |
| 4,987,387 | 1/1991 | Kennedy et al. | 331/14 X |
| 5,036,216 | 7/1991 | Hohmann et al. | 331/1 R |

FOREIGN PATENT DOCUMENTS

| 2-301223 | 12/1990 | Japan . |
| 2038579 | 7/1980 | United Kingdom . |
| 2180708 | 4/1987 | United Kingdom . |
| 2233176 | 1/1991 | United Kingdom . |

*Primary Examiner*—Siegfried H. Grimm
*Attorney, Agent, or Firm*—Ratner & Prestia

[57] ABSTRACT

A clock changeover apparatus including a reference frequency divider for dividing a reference clock by a first frequency division number; a comparative frequency divider for dividing by a second frequency division number an output clock obtained by the clock changeover apparatus; a phase comparator for comparing phase of a signal of the reference frequency divider with that of the comparative frequency divider; a clock controller for changing the output clock so as to make the phase of the signal of the reference frequency divider coincident with that of the comparative frequency divider; a clock determining member which gives an initial value of the output clock to the clock controller and is capable of selecting the initial value of the output clock arbitrarily; a changeover member for effecting changeover between the first and second frequency division numbers; and a phase lock detector for monitoring whether or not the phase of the signal of the reference frequency divider coincides with that of the comparative frequency divider.

11 Claims, 15 Drawing Sheets

5,268,654

PHASE LOCKED LOOP CLOCK CHANGEOVER APPARATUS IN WHICH THE VCO IS SET TO AN INITIAL VALUE

BACKGROUND OF THE INVENTION

1. Field of the Invention

The present invention relates to a clock changeover apparatus for changing over a plurality of clock signals.

2. Description of the Prior Art

Conventionally, when mediums having different recording and reproduction densities are recorded and reproduced by a single apparatus, clocks corresponding to kinds of the mediums, respectively are required to be provided. Meanwhile, in the case of a disk, a zone division procedure is also employed in which the disk is divided into a plurality of annular zones so as to improve its recording and reproduction densities and recording and reproduction are performed by changing the recording and reproduction densities at each of the zones. At this time, a plurality of clocks corresponding in number to the zones are required to be provided. Thus, a clock changeover apparatus for changing over the clock signals is put to practical use and known.

One example of the known clock changeover apparatus is described with reference to FIG. 14, hereinbelow. In FIG. 14, first, second and third clocks 21, 22 and 23 are different from one another. Each of the first, second and third clocks 21, 22 and 23 is formed by a crystal oscillator. The known clock changeover apparatus includes a changeover switch 24 and a central processing unit (CPU) 25. The changeover switch 24 changes over the first, second and third clocks 21, 22 and 23 so as to generate an output. The CPU 25 supplies to the changeover switch 24 a clock changeover signal 200 indicating to which one of the clocks 21-23 the changeover switch 24 should be changed over. To this end, a necessary number of lines carrying the clock changeover signal 200 are connected between the clock changeover switch 24 and the CPU 25. In case the three clocks 21-23 are provided as shown in FIG. 14, at least two lines are required for discerning three states. Alternatively, one line is used for sending data serially, while the other line is used for sending a clock signal for sampling the serially sent data. Also in this case, a plurality of states can be discerned by a total of two lines carrying the clock changeover signal 200.

Operation of the known clock changeover apparatus of the above described arrangement is described with reference to FIG. 14 and a flow chart of FIG. 15, hereinbelow. The three clocks 21-23 are oscillated at all times. The CPU 25 changes the clock changeover signal 200 to a value corresponding to one of the clocks 21-23 to be changed over and sends the clock changeover signal 200 to the changeover switch 24. Thus, the changeover switch 24 is changed over to the one of the clocks 21-23 by the clock changeover signal 200 so as to generate an output of the one of the clocks 21-23, whereby changeover to the one of the clocks 21-23 has been completed.

In the known clock changeover apparatus described above, as the number of clock signals to be changed over is increased, clocks corresponding in number to the clock signals are required to be provided and thus, a circuit scale becomes large. Meanwhile, if the clock is formed by a crystal oscillator, such a phenomenon may happen that the clock is not oscillated or is oscillated at different frequencies. Even if only one of the clocks is not oscillated or is oscillated at the different frequencies, the clock changeover apparatus does not function properly. Meanwhile, in the known clock changeover apparatus, it is impossible to confirm whether or not each of the clocks is oscillated at a proper frequency. Furthermore, in case one of the clocks is not oscillated at a proper frequency due to scatter in characteristics of constituent elements of the circuit, it is impossible to make an adjustment for reinstating the clock to the proper frequency.

SUMMARY OF THE INVENTION

Accordingly, an essential object of the present invention is to provide a clock changeover apparatus for changing over a plurality of clock signals, in which only one basic clock is employed such that a circuit scale is not changed even if the number of the clock signals to be changed over is increased and it is possible not only to confirm whether or not the clock is oscillated properly but to adjust the clock In order to accomplish this object of the present invention, a clock changeover apparatus embodying the present invention comprises, as a first arrangement, a reference frequency divider means for dividing a reference clock by a first frequency division number, a comparative frequency divider means for dividing by a second frequency division number an output clock obtained by the clock changeover apparatus, a phase comparator means for comparing phase of a signal of the reference frequency divider means with phase of a signal of the comparative frequency divider means, a clock control means for changing the output clock so as to make the phase of the signal of the reference frequency divider means coincident with the phase of the signal of the comparative frequency divider means, a clock determining means which gives an initial value of the output clock to the clock control means and is capable of selecting the initial value of the output clock arbitrarily, a changeover means for effecting changeover between the first and second frequency division numbers and a phase lock detecting means for monitoring whether or not the phase of the signal of the reference frequency divider means coincides with the phase of the signal of the comparative frequency divider means or an output clock measuring means for measuring frequency of the output clock.

By this first arrangement of the present invention, the single basic clock is divided by N by the reference frequency divider means and the central frequency is supplied as the initial value of the output clock. Thus, the output clock is divided by M by the comparative frequency divider means such that the output clock equal to product of the basic clock and (M/N) is obtained by making the phases of the two frequency division signals coincident with each other. At this time, if the frequency division numbers N and M are changed, the output clock can be changed, so that the circuit scale does not change even if the number of the clock signals to be changed over is increased. Meanwhile, after change of the frequency division numbers, if the phase lock is detected by the phase lock detecting means or it is found by the output clock measuring means that the output clock has a proper frequency, it can be confirmed that the clock is oscillated properly. Meanwhile, even in case the central frequency deviates from the preset value, namely, the phase lock is not performed or the output clock does not have the proper frequency, the clock can be adjusted so as to be oscillated properly by changing over the output clock to another central frequency.

Meanwhile, in addition to the first arrangement, the clock changeover apparatus includes, as a second arrangement, a first stop means for stopping operation of the reference clock and the comparative frequency divider means or a second stop means for stopping operation of the reference frequency divider means and the comparative frequency divider means or a third stop means for stopping operation of the phase comparator means or a fourth stop means for stopping operation of the clock control means.

By the second arrangement of the present invention, the closed loop controlling the clock is cut and the central frequency corresponding to the initial value (free run frequency) can be measured. Even if the central frequency deviates from the preset value, namely, the phase lock is not performed or the output clock does not have the proper frequency) the clock can be adjusted so as to be oscillated properly by changing over the output clock to another central frequency.

Furthermore, in addition to the first and second arrangements, the clock changeover apparatus includes, as a third arrangement, an initial value changing means which displaces the initial value of the output clock relatively by giving an offset without changing a changeover range of the clock determining means so as to change the changeover range of the clock determining means.

By the third arrangement of the present invention, even if the central frequency deviates from the preset value, the output clock can be changed over to another central frequency by adding the offset, so that the clock can be adjusted so as to oscillated properly.

BRIEF DESCRIPTION OF THE DRAWINGS

This object and features of the invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DESCRIPTION OF THE PREFERRED EMBODIMENTS

Figure 1:
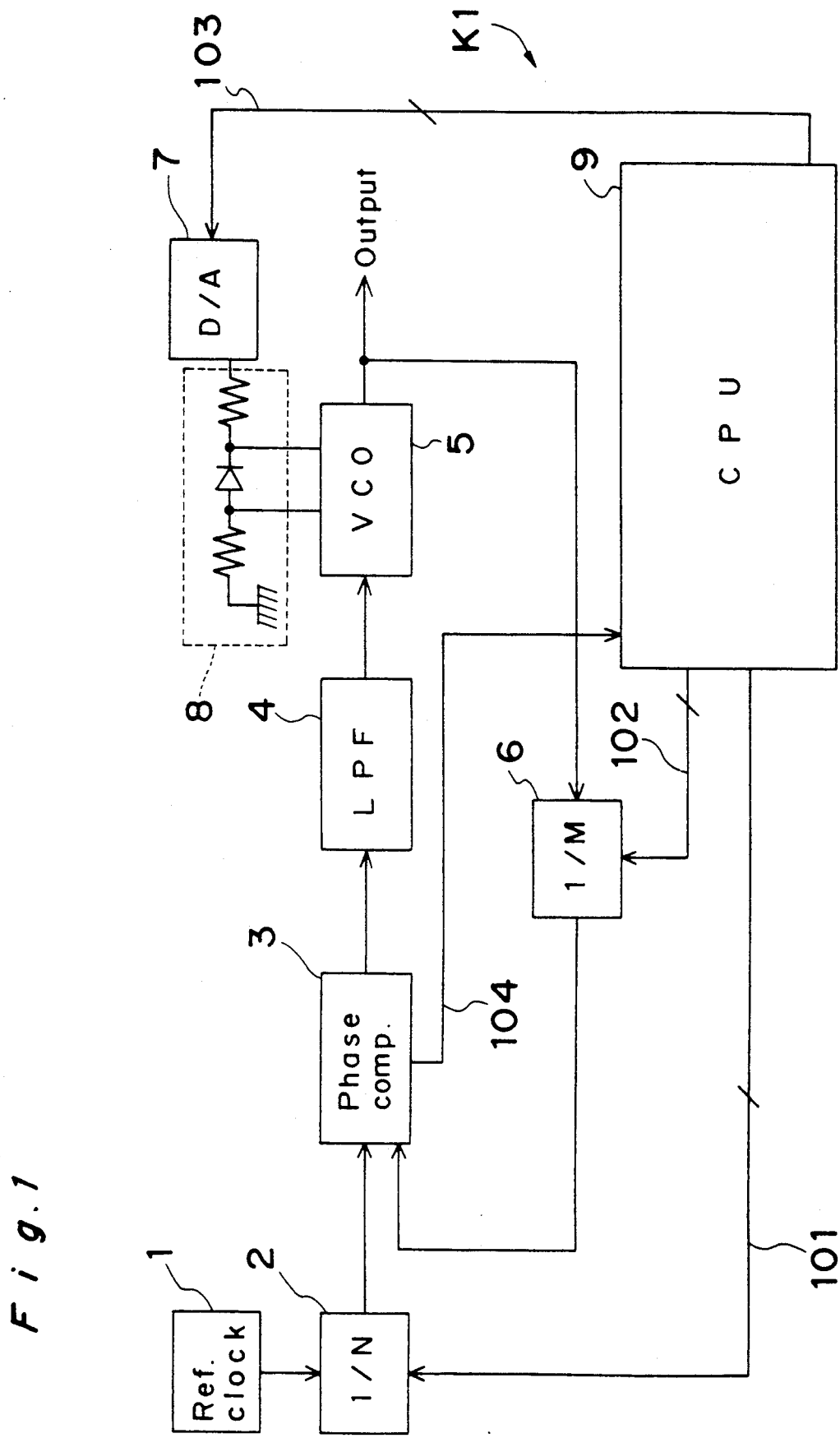
FIG. 1 is a block diagram of a clock changeover apparatus according to a first embodiment of the present invention.
Figure 2:
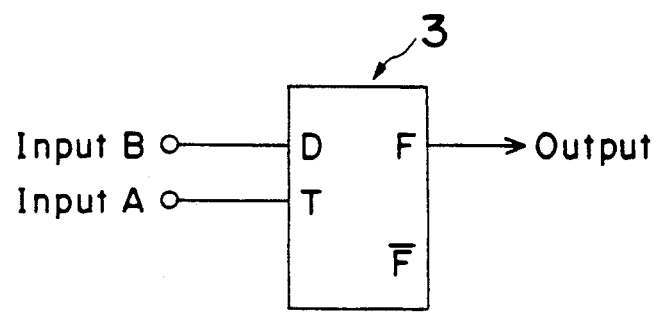
FIG. 2 is a view showing a phase comparator employed in the clock changeover apparatus of FIG. 1.

Referring now to the drawings, there is shown in FIG. 1, a clock changeover apparatus K1 for changing over a plurality of clock signals, according to a first embodiment of the present invention. The clock changeover apparatus K1 includes a reference clock 1, a reference frequency divider 2 for dividing the reference clock 1 by N, a phase comparator 3 and a comparative frequency divider 6 for dividing an output clock by M. The phase comparator 3 compares phase of an output signal of the reference frequency divider 2 with phase of an output signal of the comparative frequency divider 6 so as to control an output voltage of the phase comparator 3 in accordance with phase difference (frequency difference). When frequency of the reference frequency divider 2 is higher than that of the comparative frequency divider 6, output voltage is set to a positive value. On the contrary, when frequency of the reference frequency divider 2 is lower than that of the comparative frequency divider 6, output voltage is set to a negative value. FIG. 2 shows one example of the phase comparator 2.

Figure 3:
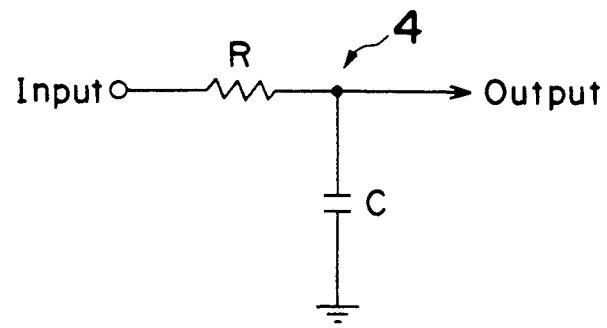
FIG. 3 is a view showing a low-pass filter employed in the clock changeover apparatus of FIG. 1.
Figure 4:
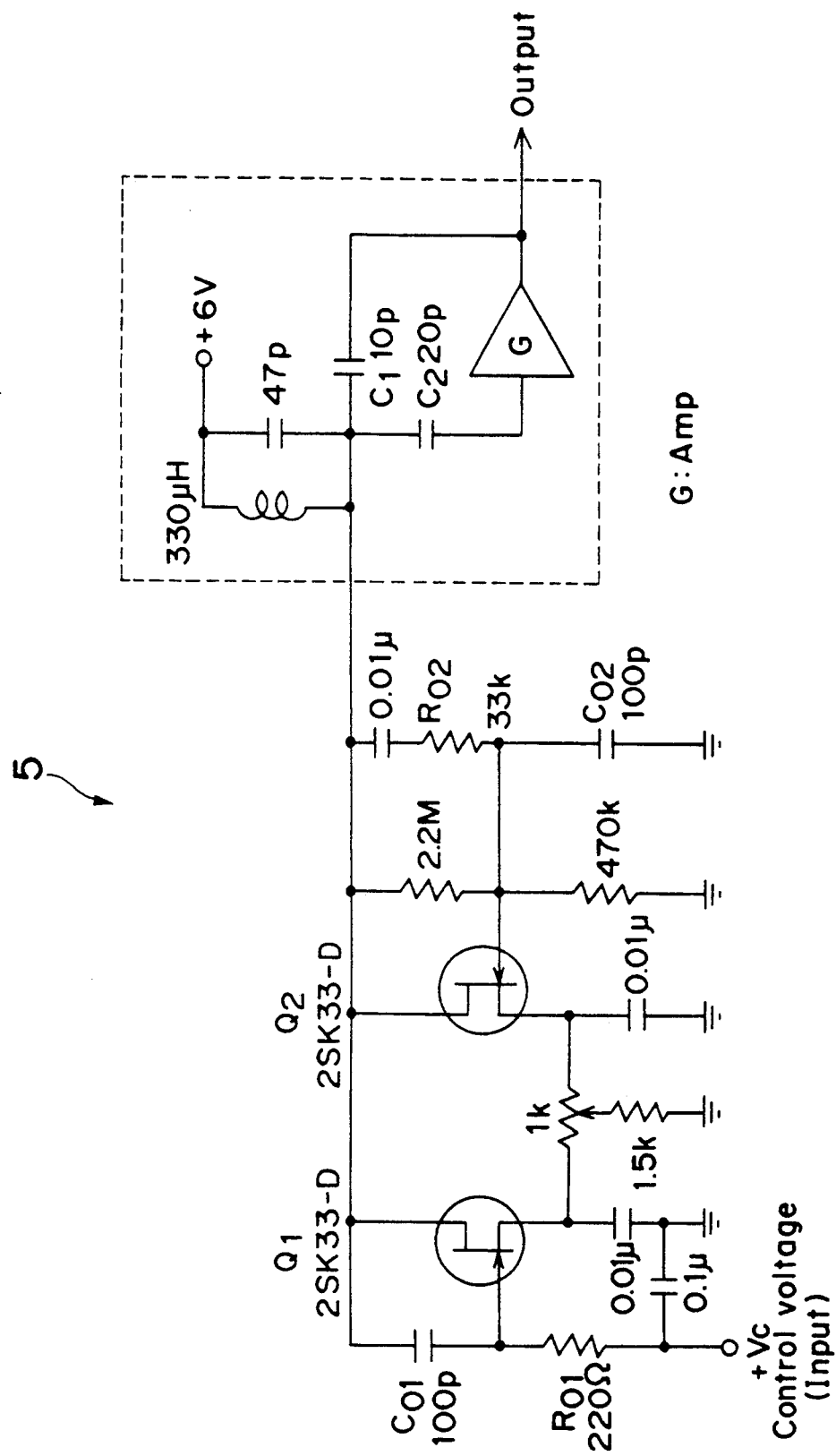
FIG. 4 is a circuit diagram showing a voltage controlled oscillator employed in the clock changeover apparatus of FIG. 1.

The clock changeover apparatus K1 further includes a low-pass filter (LPF) 4 receiving a comparative output of the phase comparator 3, a voltage controlled oscillator (VCO) 5, a digital-to-analog converter 7, a resistor ladder network 8 and a central processing unit (CPU) 9. The LPF 4 has a function of determining response speed so as to stabilize response speed. FIG. 3 shows the simplest arrangement of the LPF 4 in which the LPF 4 is constituted by a resistor R and a capacitor C. The VCO 5 controls the oscillation frequency (output clock) on the basis of an initial voltage corresponding to a central frequency provided by the resistor ladder network 8 and an output voltage of the LPF 4. When the output voltage of the LPF 4 assumes a positive value, the VCO 5 raises the output clock. On the other hand, when the output voltage of the LPF 4 assumes a negative value, the VCO 5 lowers the output clock. FIG. 4 shows one example of the VCO 5. A digital value of the central frequency is applied to the digital-to-analog converter 7 by a signal 103 to be described later so as to be converted into a voltage by the digital-to-analog converter 7. The resistor ladder network 8 is constituted by resistors and a diode and supplies, as a voltage difference between 0 V and a voltage of the digital-to-analog converter 7, to the VCO 5 the initial voltage corresponding to the central frequency. The CPU 9 supplies the frequency division number N, the frequency division number M and the central frequency k to the reference frequency divider 1, the comparative frequency divider 6 and the digital-to-analog converter 7, respectively. In FIG. 1, reference numeral 101 denotes a reference frequency division number indicative of the frequency division number N, while reference numeral 102 denotes a comparative frequency division number indicative of the frequency division number M. Meanwhile, the signal 103 bears the central frequency which is given to the digital-to-analog converter 7 by the CPU 9 and can be arbitrarily selected by the CPU 9. The central frequency (initial output clock) is determined by scatter in characteristics of the VCO 5, the digital-to-analog converter 7 and the resistor ladder network 8 and is selected by the signal 103. Thus, generally, the output clock and the central frequency which are obtained finally are different from each other. The central frequency should fall in a frequency range enabling lead-in in a closed loop. Reference numeral 104 denotes a phase lock signal. When the phase comparator 3 has been phase locked, the phase lock signal 104 is generated so as to be applied to the CPU 9. When the phase lock signal 104 assumes "1" and "0", phase is locked and unlocked, respectively. The circuits shown in FIGS. 2 to 4 are generally known from, for example, a book entitled "Practical Circuit Manual on Linear IC" written by Yoshiro Yokoi and published by Radio Technology Co., Ltd. of Japan on Apr. 20, 1975.

Figure 5:
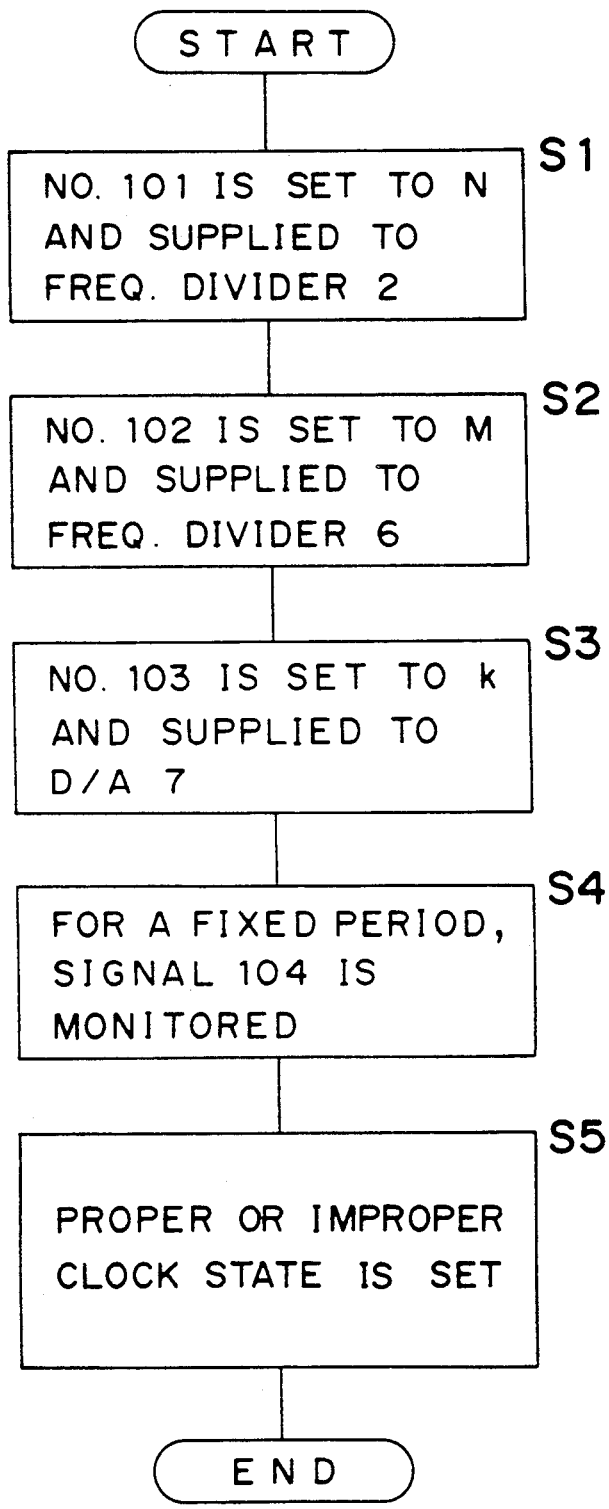
FIG. 5 is a flow chart showing operation of the clock changeover apparatus of FIG. 1.

Operation of the clock changeover apparatus K1 of the above described arrangement is described with reference to FIG. 1 and a flow chart of FIG. 5, hereinbelow. At step S1, the CPU 9 sets the reference frequency division number 101 to N and supplies the reference frequency division number 101 to the reference frequency divider 2. The reference frequency divider 2 divides the reference clock 1 by N and supplies the frequency division signal to the phase comparator 3. Then, at step S2, the CPU 9 sets the comparative frequency division number 102 to M and supplies the comparative frequency division number 102 to the comparative frequency divider 6. Subsequently, at step S3, the CPU 9 sets the central frequency 103 to k and supplies the central frequency 103 to the digital-to-analog converter 7. The digital-to-analog converter 7 converts the central frequency k into the voltage. This voltage is applied, through the resistor ladder network 8, to the VCO 5 as the initial voltage. The VCO 5 generates an output clock having a frequency corresponding to the initial voltage and applies the output clock to the comparative frequency divider 6. The comparative frequency divider 6 divides the output clock by M and outputs the frequency division signal to the phase comparator 3. The phase comparator 3 compares phase of the signal from the reference frequency divider 2 with phase of the signal from the comparative frequency divider 6 so as to output a voltage in accordance with the phase difference (frequency difference). If the voltage obtained by the phase comparator 3 assumes a positive value, frequency of the reference frequency divider 2 is higher than that of the comparative frequency divider 6. On the contrary, when the voltage obtained by the phase comparator 3 assumes a negative value, frequency of the reference frequency divider 2 is lower than that of the comparative frequency divider 6. In order to fetch the output voltage of the phase comparator 3 as DC, the output voltage of the phase comparator 3 is passed through the LPF 4. The output voltage of the LPF 4 is inputted to the VCO 5 and thus, the VCO 5 controls the oscillation frequency (output clock) on the basis of the initial voltage and the output voltage of the LPF 4. When the output voltage of the LPF 4 assumes a positive value, the VCO 5 raises the output clock. On the contrary, when the output voltage of the LPF 4 assumes a negative value, the VCO 5 lowers the output clock.

Thus, by performing feedback in a closed loop constituted by the phase comparator 3, the LPF 4, the VCO 5 and the comparative frequency divider 6, phase (frequency) of the signal of the reference frequency divider 2 is finally made coincident with that of the signal of the comparative frequency divider 6. Assuming here that character Fs denotes a reference clock and character Fo denotes an output clock, the relation of (Fs/N=Of/M) leads to the relation of (Fo=Fs×M/N). Thus, the output clock determined by M and N can be obtained. However, if a difference between the central frequency given as an initial value of the VCO 5 and the final output clock is extremely large, the difference exceeds a variable range of the control voltage of the phase comparator 3 and the VCO 5 and thus, feedback is not performed. Therefore, the central frequency k should be selected so as to be approximate to the final output clock, in other words, fall in a frequency range enabling lead-in in the closed loop. By performing feedback as described above, a state in which phase (frequency) of the signal of the reference frequency divider 2 is not coincident with that of the comparative frequency divider 6, i.e. the phase lock signal 104 assumes "0" to a state in which phase (frequency) of the signal of the reference frequency divider 2 is coincident with that of the comparative frequency divider 6, i.e. the phase lock signal 104 assumes "1".

For a predetermined period after the CPU 9 has supplied the reference frequency division number 101, the comparative frequency division number 102 and the central frequency k, the CPU 9 monitors the phase lock signal 104 so as to check whether the phase lock signal 104 assumes "1" at step S4. The predetermined period is determined by frequency characteristics of the closed loop. If the phase lock signal 104 assumes "1", a proper clock state is confirmed in which the circuit is functioning properly and changeover of the clock signals also has been performed. If the phase lock signal 104 is kept at "0", an improper clock state is confirmed in which the circuit is not functioning properly at step S5. In case the output clock is changed over, values of the reference frequency division number 101, the comparative frequency division number 102 and the central frequency 103 should be changed. Furthermore, even in the improper clock state, if the above operation is performed again by arbitrarily selecting the central frequency k such that the central frequency k falls in a frequency range enabling lead-in in the closed loop, the proper clock state can be obtained. Thus, even if there is scatter in production accuracy of the circuit, the clock can be adjusted.

As described above, the phase lock signal 104 is provided in this embodiment of the present invention. Therefore, if the period from a time point when the reference frequency division number 101, the comparative frequency division number 102 and the central frequency 103 are changed to a time point when the phase lock signal 104 assumes "1" is obtained, lock period of the clock changeover apparatus can be measured. Meanwhile, as self-diagnosis function, it is possible to preliminarily confirm whether or not all the clock signals to be changed over are in the proper clock state.

Figure 6:
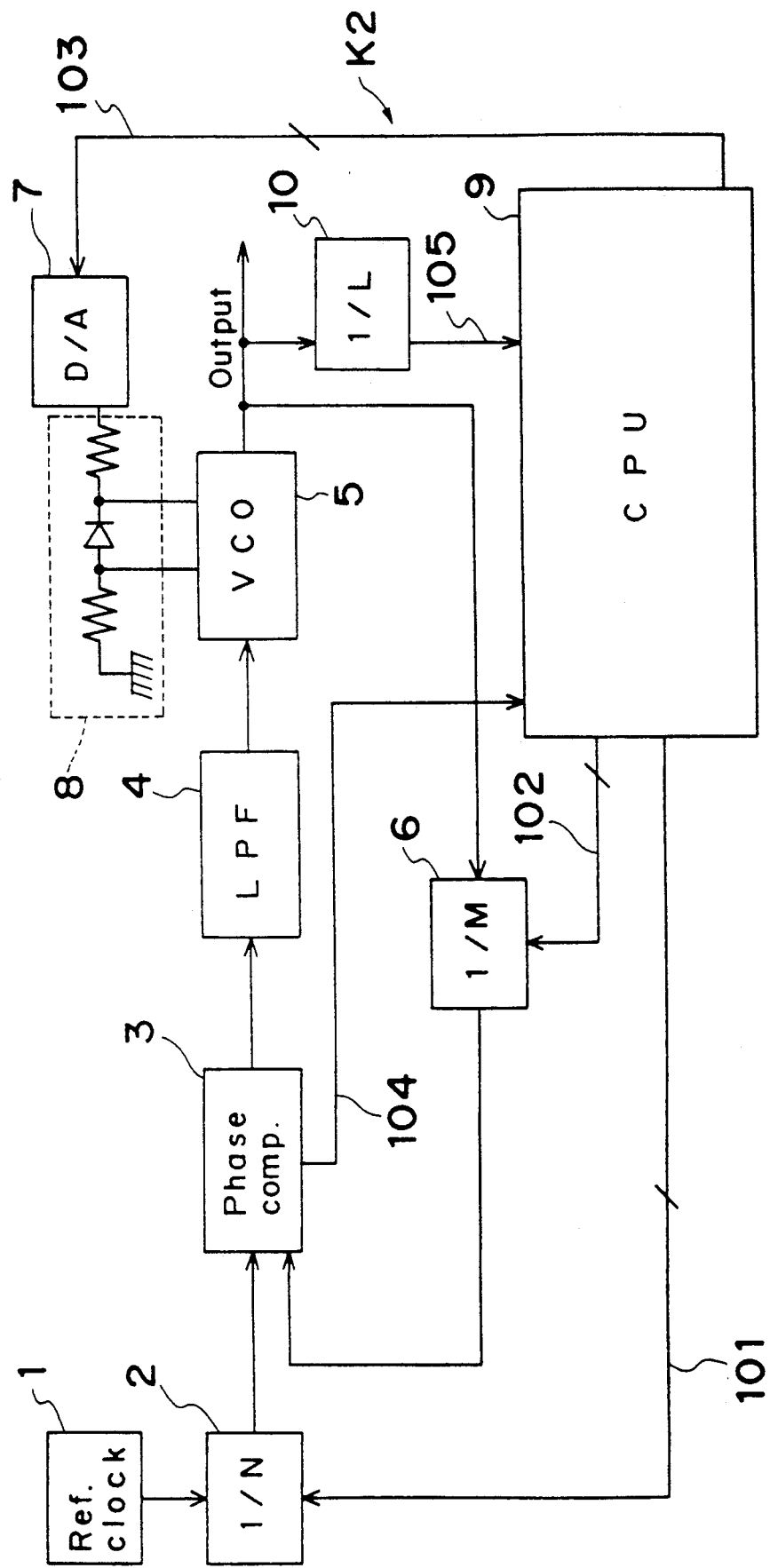
FIG. 6 is a block diagram of a clock changeover apparatus according to a second embodiment of the present invention.

Hereinbelow, a clock changeover apparatus K2 according to a second embodiment of the present invention is described with reference to FIG. 6. In comparison with the clock changeover apparatus K1, a frequency divider 10 and an output pulse 105 are additionally provided in the clock changeover apparatus K2. Thus, only the frequency divider 10, the output pulse 105 and the CPU 9 are described here. The frequency divider 10 divides the output clock by L into the output pulse 105 of a time range countable by the CPU 9. The CPU 9 monitors the output pulse 105 so as to count the number of pulses per unit interval. For example, if L is 5 and 10 pulses are counted during 1 msec, the output pulse 105 has 10 kHz and the original output clock has 50 kHz. Alternatively, it may also be so arranged that the CPU 9 measures a duration per unit number of pulses.

Figure 7:
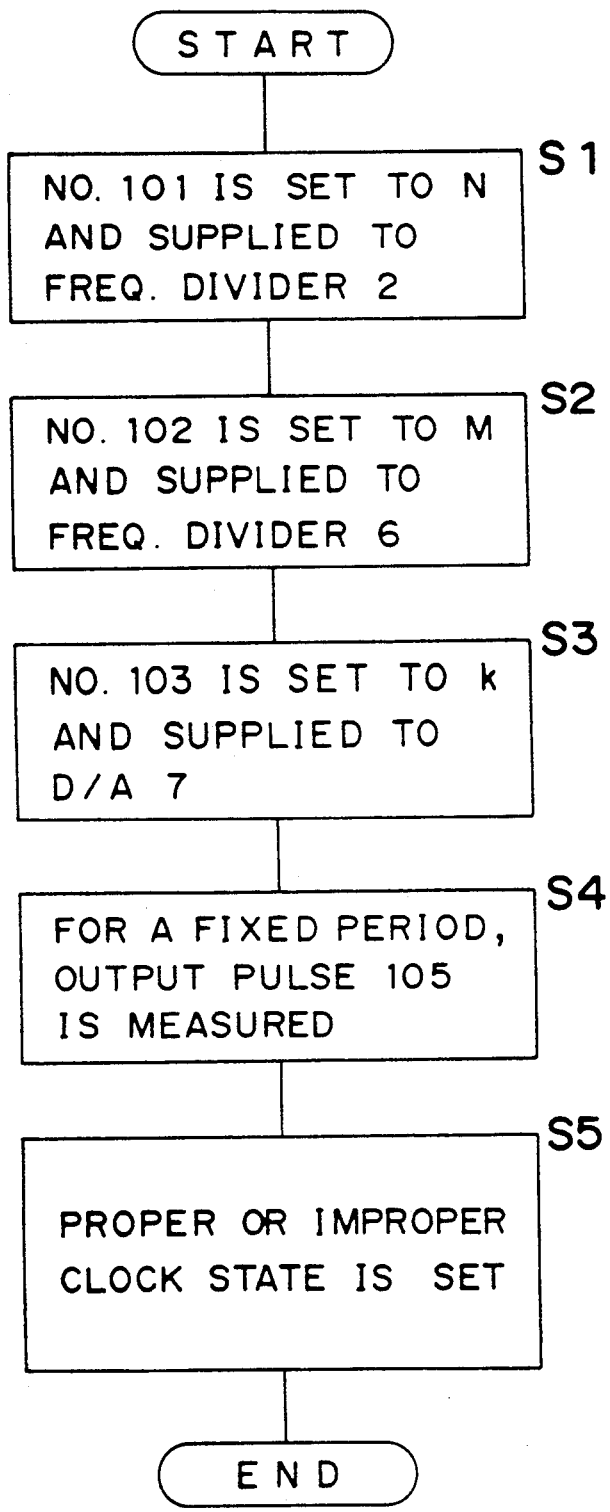
FIG. 7 is a flow chart showing operation of the clock changeover apparatus of FIG. 6.

Operation of the clock changeover apparatus K2 of the above described arrangement is described with reference to FIG. 6 and a flow chart of FIG. 7, hereinbelow. It is assumed here that the CPU 9 does not use the phase lock signal 104. At step S1, the CPU 9 sets the reference frequency division number 101 to N and supplies the reference frequency division number 101 to the reference frequency divider 2. The reference frequency divider 2 divides the reference clock 1 by N and supplies the frequency division signal to the phase comparator 3. Then, at step S2, the CPU 9 sets the comparative frequency division number 102 to M and supplies the comparative frequency division number 102 to the comparative frequency divider 6. Subsequently, at step S3, the CPU 9 sets the central frequency 103 to k and supplies the central frequency 103 to the digital-to-analog converter 7. The digital-to-analog converter 7 converts the central frequency k into a voltage. This voltage is applied, through the resistor ladder network 8, to the VCO 5 as the initial voltage. The VCO 5 generates an output clock having a frequency corresponding to the initial voltage and applies the output clock to the comparative frequency comparator 6. The comparative frequency divider 6 divides the output clock by M and outputs the frequency division signal to the phase comparator 3. The phase comparator 3 compares phase of the signal from the reference frequency divider 2 with phase of the signal from the comparative frequency divider 6 so as to output a voltage in accordance with the phase difference (frequency difference). If the voltage obtained by the phase comparator 3 assumes a positive value, frequency of the reference frequency divider 2 is higher than that of the comparative frequency divider 6. On the contrary, when the voltage obtained by the phase comparator 3 assumes a negative value, frequency of the reference frequency divider 2 is lower than that of the comparative frequency divider 6. In order to fetch the output voltage of the phase comparator 3 as DC, the output voltage of the phase comparator 3 is passed through the LPF 4. The output voltage of the LPF 4 is inputted to the VCO 5 and thus, the VCO 5 controls the oscillation frequency (output clock) on the basis of the initial voltage and the output voltage of the LPF 4. When the output voltage of the LPF 4 assumes a positive value, the VCO 5 raises the output clock. On the contrary, when the output voltage of the LPF 4 assumes a negative value, the VCO 5 lowers the output clock.

Thus, by performing feedback in a closed loop constituted by the phase comparator 3, the LPF 4, the VCO 5 and the comparative frequency divider 6, phase (frequency) of the signal of the reference frequency divider 2 is finally made coincident with that of the signal of the comparative frequency divider 6. Assuming at this time that character Fs denotes a reference clock and character Fo denotes an output clock, the relation of (Fs/N=Fo/M) leads to the relation of (Fo=Fs×M/N). Thus, the output clock determined by M and N can be obtained. However, if a difference between the central frequency given as an initial value of the VCO 5 and the final output clock is extremely large, the difference exceeds a variable range of the control voltage of the phase comparator 3 and the VCO 5 and thus, feedback is not performed. Therefore, the central frequency k should be selected so as to be approximate to the final output clock, in other words, fall in a frequency range enabling lead-in in the closed loop. By performing feedback as described above, a state in which phase (frequency) of the signal of the reference frequency divider 2 is not coincident with that of the comparative frequency divider 6, i.e. the phase lock signal 104 assumes "0" to a state in which phase (frequency) of the signal of the reference frequency divider 2 is coincident with that of the comparative frequency divider 6, i.e. the phase lock signal 104 assumes "1". At this time, the output clock of the output of the VCO 5 assumes Fo which is determined by M, N and Fs. This output clock of the VCO 5 is divided by L so as to be sent, as the output pulse 105, to the CPU 9.

For a predetermined period after the CPU 9 has supplied the reference frequency division number 101, the comparative frequency division number 102 and the central frequency, the CPU 9 measures the output pulse 105 so as to check whether the output pulse 105 reaches a preset frequency at step S4. The predetermined period is determined by frequency characteristics of the closed loop. If the output pulse 105 has reached the preset frequency, a proper clock state is confirmed in which the circuit is functioning properly and changeover of the clock signals also has been performed. On the contrary, if the output pulse 105 does not reach the preset frequency, an improper clock state is confirmed in which the circuit is not functioning properly at step S5. In case the output clock is changed over, values of the reference frequency division number 101, the comparative frequency division number 102 and the central frequency 103 should be changed. Furthermore, even in the improper clock state, if the above operation is performed again by arbitrarily selecting the central frequency k, the proper clock state can be obtained. Thus, even if there is scatter in production accuracy of the circuit, the clock signals can be adjusted.

As described above, in place of the phase lock signal 104, the frequency divider 10 and the output pulse 105 are employed as means for measuring the output clock in the second embodiment of the present invention. Therefore, in the second embodiment of the present invention, even if the phase lock signal is not available, the same effects as those of the first embodiment can be obtained. Meanwhile, in the second embodiment of the present invention, the phase lock signal 104 is not used but may also be used additionally.

Figure 8:
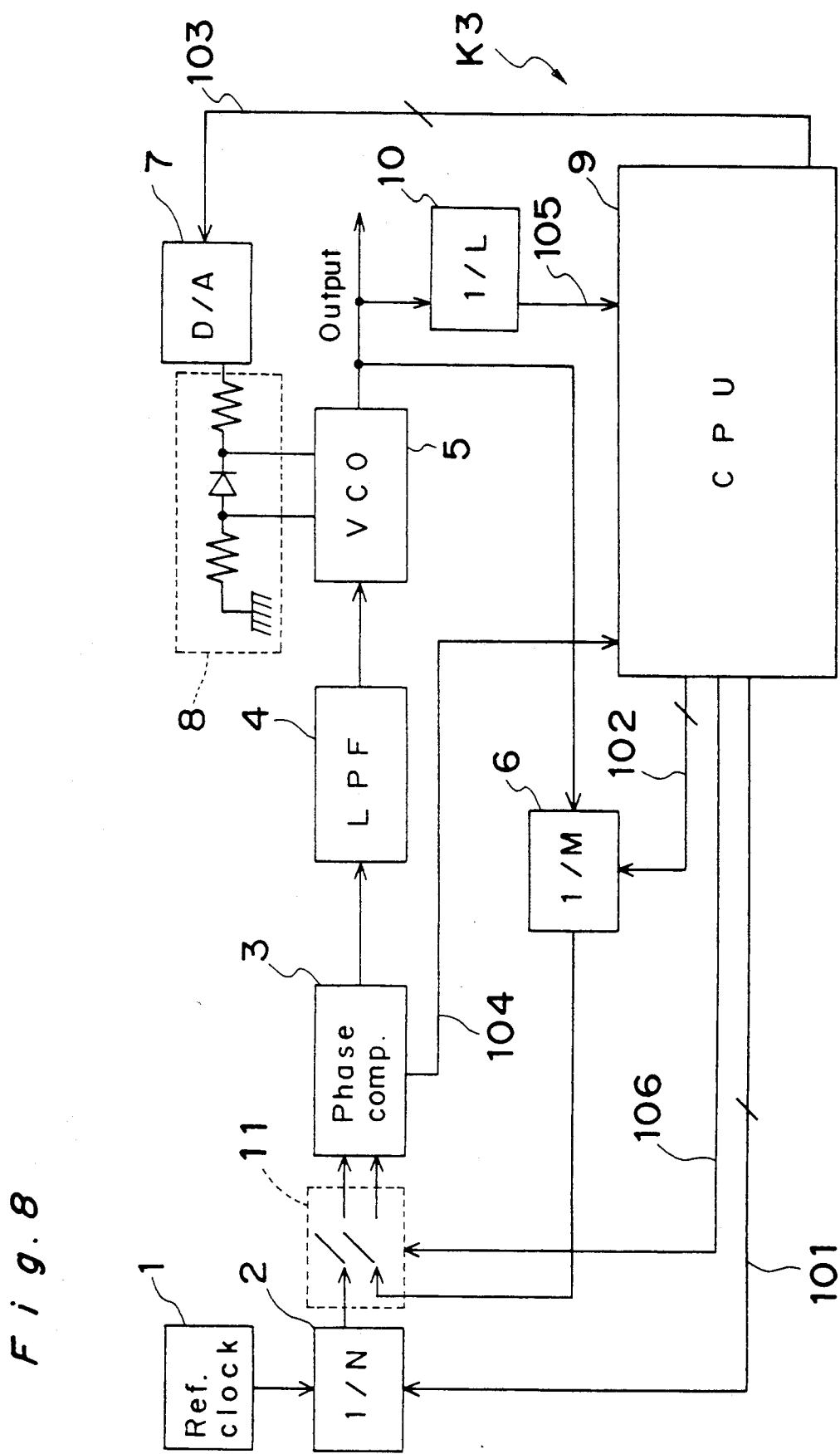
FIG. 8 is a block diagram of a clock changeover apparatus according to a third embodiment of the present invention.

Hereinbelow, a clock changeover apparatus K3 according to a third embodiment of the present invention is described with reference to FIG. 8. As compared with the clock changeover apparatus K2, a switch 11 is added and operation of only the CPU 9 is different in the clock changeover apparatus K3. Thus, only the switch 11 and the CPU 9 are described here. The switch 11 is provided for turning on or off the signals of the reference frequency divider 2 and the comparative frequency divider 6. The CPU 9 controls a switching signal 106. In case the switching signal 106 assumes "1", the switch 11 is turned off and thus, the loop of the phase comparator 3, the LPF 4, the VCO 5 and the comparative frequency divider 6 is opened. On the other hand, in case the switching signal 106 assumes "0", the switch 11 is turned on and thus, the loop of the phase comparator 3, the LPF 4, the VCO 5 and the comparative frequency divider 6 is closed.

Figure 9:
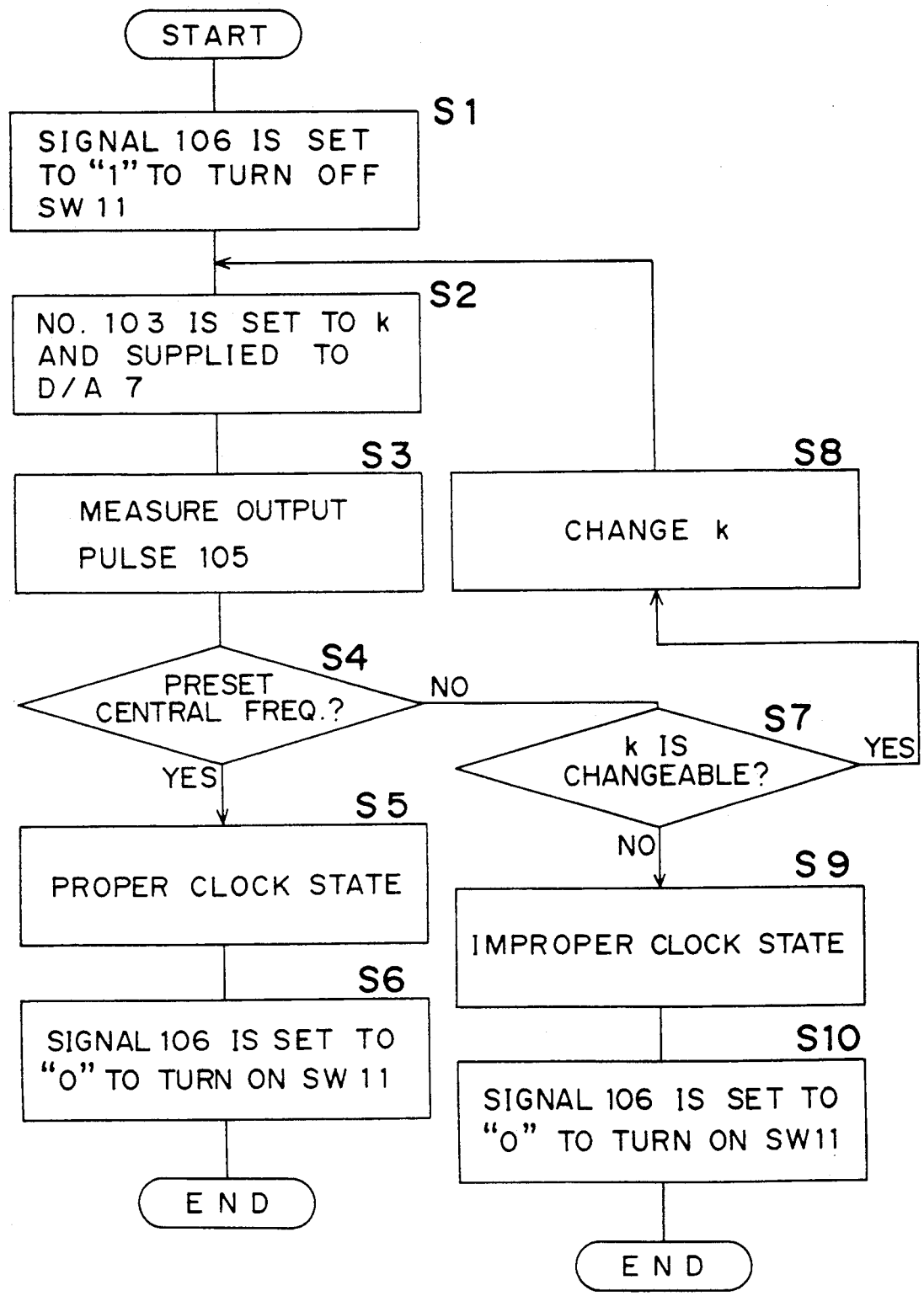
FIG. 9 is a flow chart showing operation of the clock changeover apparatus of FIG. 8.

Operation of the clock changeover apparatus K3 of the above described arrangement is described with reference to FIG. 8 and a flow chart of FIG. 9. The central frequency changes according to scatter in characteristics of the digital-to-analog converter 7, the resistor ladder network 8 and the VCO 5 in the circuit. Therefore, when the central frequency is preliminarily determined in accordance with the clock signals to be changed over as in the case where the central frequency k is not adjusted in the first and second embodiments of the present invention, such a phenomenon may happen in which the central frequency changes due to scatter in characteristics of the digital-to-analog converter 7, the resistor ladder network 8 and the VCO 5 so as to exceed a frequency range enabling lead-in in the closed loop and thus, the improper clock state is obtained when changeover to a specific clock signal has been performed. In this case, the clock changeover apparatus itself is defective and thus, cannot be used. The central frequency should fall within a frequency range enabling lead-in in the closed loop. Meanwhile, in the first and second embodiments of the present invention, if adjustment of the central frequency k is made by selecting the central frequency k, the above described problem can be solved.

In order to avoid the above mentioned state, the central frequency is adjusted beforehand as follows.

(A) The CPU 9 sets the switching signal 106 to "1" so as to turn off the switch 11 at step S1. At step S2, the CPU 9 sets the central frequency 103 to k so as to supply the central frequency 103 to the digital-to-analog converter 7. The digital-to-analog converter 7 converts the central frequency k into a voltage. This voltage is applied, through the resistor ladder network 8, to the VCO 5 as the initial voltage. The VCO 5 generates an output clock having a frequency corresponding to the initial voltage and applies the output clock to the comparative frequency comparator 6. The comparative frequency divider 6 divides the output clock by M. Since the switch 11 is in the OFF state so as to obtain the open loop, the phase comparator 3 determines that phase of the output signal of the reference frequency divider 2 is the same as that of the output signal of the comparative frequency divider 6 and the output voltage of the phase comparator 3 assumes zero. In order to fetch the output voltage of the phase comparator 3 as DC, the output voltage of the phase comparator 3 is passed through the LPF 4. The output voltage of the LPF 4 is inputted to the VCO 5 and thus, the VCO 5 controls the oscillation frequency (output clock) on the basis of the initial voltage and the output voltage of the LPF 4. Since the output voltage of the LPF 4 is zero, the output clock becomes the central frequency itself.

At step S3, the CPU 9 measures the output pulse 105 so as to obtain the central frequency. It is judged at step S4 whether or not the central frequency is the preset central frequency falling in a frequency range enabling lead-in in the closed loop. In the case of "YES" at step S4, the proper clock state is confirmed at step S5 in which the circuit is functioning properly. In this case, the CPU 9 sets the switching signal 106 to "0" so as to turn on the switch 11 at step S6.

Meanwhile, if it is found at step S7 that the central frequency k can be changed in the case of "NO" at step S4, the central frequency k is changed at step S8 and the program flow returns to step S2 such that the above mentioned operation is repeated by giving the central frequency k to the digital-to-analog converter 7.

On the other hand, if it is found at step S7 that the central frequency k cannot be changed, the improper clock state is confirmed at step S9 in which the circuit is not functioning properly. In this case, the CPU 9 sets the switching signal 106 to "0" so as to turn on the switch 11 at step S10.

(B) In the same manner as in the first and second embodiments of the present invention, it is confirmed by using the central frequency k obtained in above (A) whether or not the proper clock state is obtained. Since the CPU 9 sets the switching signal 106 to "0" so as to turn on the switch 11 at the final stage of about (A), the closed loop is obtained and thus, feedback is performed.

(C) Above mentioned (A) and (B) are performed for all clock signals to be changed over. In case the output clock is changed over, the reference frequency division number 101, the comparative frequency division number 102 and the central frequency 103 are required to be changed. When all the clock signals are proper, adjustments of the central frequency have been completed.

When the clock signals are changed actually, the central frequency is set as follows.

(D) In the same manner as in the first and second embodiments of the present invention, it is confirmed by using the central frequency k obtained in above (A) and (B) whether or not the proper clock state is obtained.

As described above, since the switch 11 for opening or closing the loop and the switching signal 106 are provided in the third embodiment of the present invention, the central frequency k is obtained in accordance with scatter in production accuracy of the circuit. Thus, when the central frequency k is improper, the improper clock state can be eliminated by changing k. Furthermore, by comparing the central frequency before adjustments with the central frequency after adjustments, it becomes possible to grasp performance of the circuit.

Figure 10:
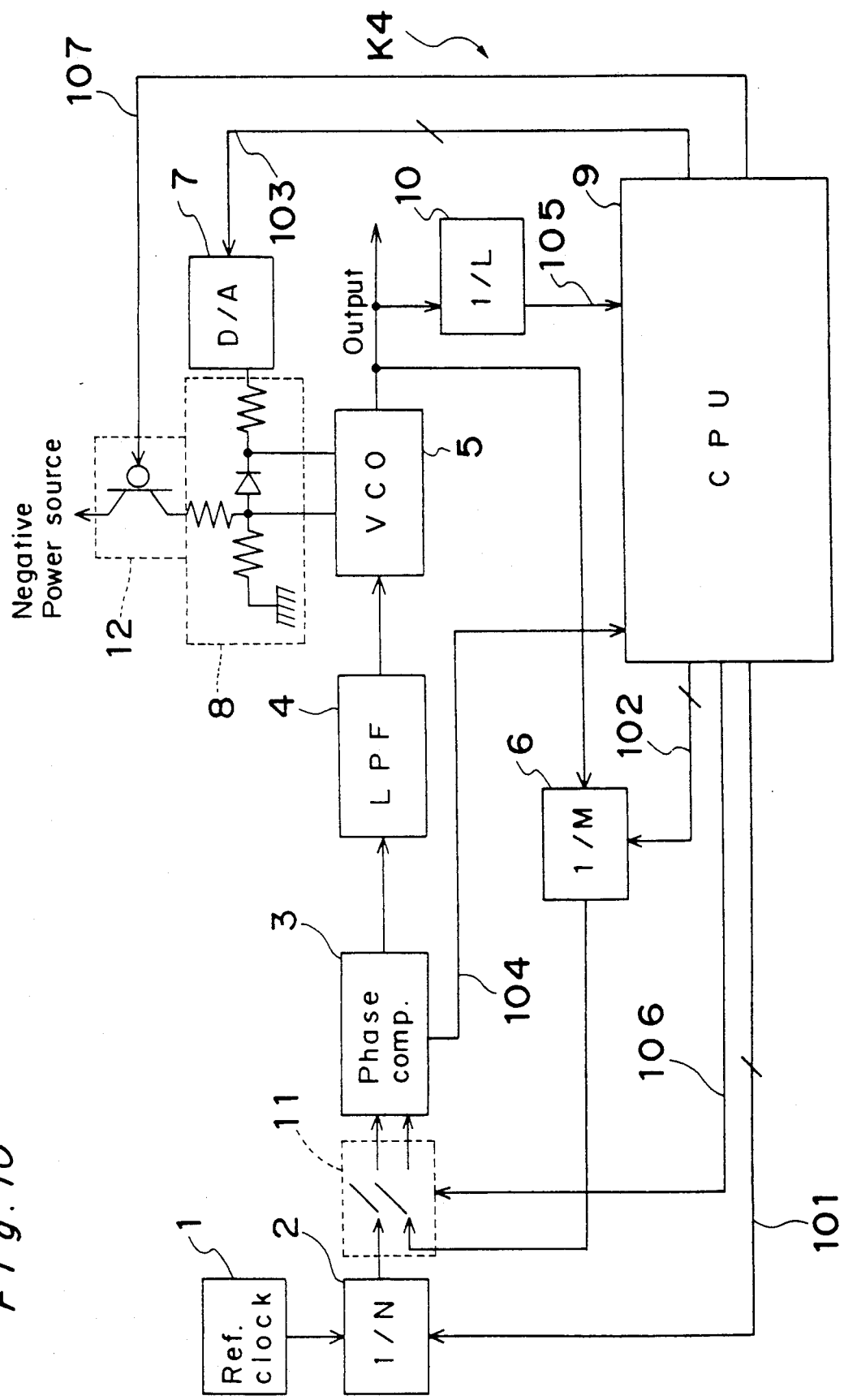
FIG. 10 is a block diagram of a clock changeover apparatus according to a fourth embodiment of the present invention.

Hereinbelow, a clock changeover apparatus K4 according to a fourth embodiment of the present invention is described with reference to FIG. 10. In comparison with the clock changeover apparatus K3, an offset 12 is added and operation of only the resistor ladder network 8 and the CPU 9 is different in the clock changeover apparatus K4. Hence, only the offset 12, the resistor ladder network 8 and the CPU 9 are described here. By using a negative power source, the offset 12 applies a negative voltage so as to increase voltage supplied to the VCO 5 through the resistor ladder network 8. When a boost signal 107 assumes "0", the boost signal 107 turns off the offset 12 and thus, potential difference determined by only the digital-to-analog converter 7 is supplied to the VCO 5 without adding the negative voltage. On the other hand, when the boost signal 107 assumes "1", the boost signal 107 turns on the offset 12, so that the negative voltage is applied to the VCO 5 by the offset 12 the thus, potential difference between the between potential of the digital-to-analog converter 8 and negative potential of the offset 12 is applied to the VCO 5. The CPU 9 controls the boost signal 107.

Operation of the clock changeover apparatus of the above described arrangement is described with reference to FIG. 10 and flow charts of FIGS. 11(a) and 11(b), 12 and 13, hereinbelow. When the central frequency k is adjusted as in the clock changeover apparatus K3, such a phenomenon in which even if the central frequency k is changed sequentially, the actual central frequency remains so as to deviate from a frequency range enabling lead-in in the closed loop may happen, for example, in the following cases (1) to (3).

(1) Due to low resolution of the digital-to-analog converter 7 or scatter in production accuracy of the circuit, the frequency ranges enabling lead-in for the respective central frequencies do not overlap each other sufficiently, so that all the frequencies to be changed over cannot be covered.

(2) Even if resolution of the digital-to-analog converter 7 is high, the actual central frequency becomes high due to scatter in production accuracy of the circuit and thus, a low frequency range cannot be covered.

(3) Even if resolution of the digital-to-analog converter 7 is high, the actual central frequency becomes low and thus, a high frequency range cannot be covered.

In any of the cases (1) to (3), the clock changeover apparatus becomes defective. In order to solve the problems (1) to (3), the following countermeasures may be considered. Namely, the voltage range applied to the VCO 5 is moved to a positive side or a negative side against the problem (1), only a smaller side of the potential difference applied to the VCO 5 is further reduced against the problem (2) and only a higher side of the potential difference applied to the VCO 5 is further increased against the problem (3). In order to effect the above change without changing the digital-to-analog converter 7, attention is directed to the offset 12 for applying voltage to the VCO 5 and the boost signal 107 for controlling the offset 12. By using the offset 12 additionally, potential difference can cover an offset variable voltage range imparted by the offset 12 in addition to the original variable voltage range. Voltage applied by the offset 12 assumes a positive value or a negative value depending on cases. In the case where the actual central frequency becomes high, a positive power source is employed for the offset 12 in place of the negative power source. If required offset of the voltage is small, voltage applied by the offset 12 also becomes small. On the contrary, if required offset of the voltage is large, voltage applied by the offset 12 also becomes large. It is needless to say that the digital-to-analog converter 7 may be changed without using the offset 12. In this case, the clock changeover apparatus K4 becomes identical with the clock changeover apparatus K3.

In order to materialize the countermeasures against the problems (1) to (3), the central frequency is preliminarily adjusted as follows.

Figure 11A:
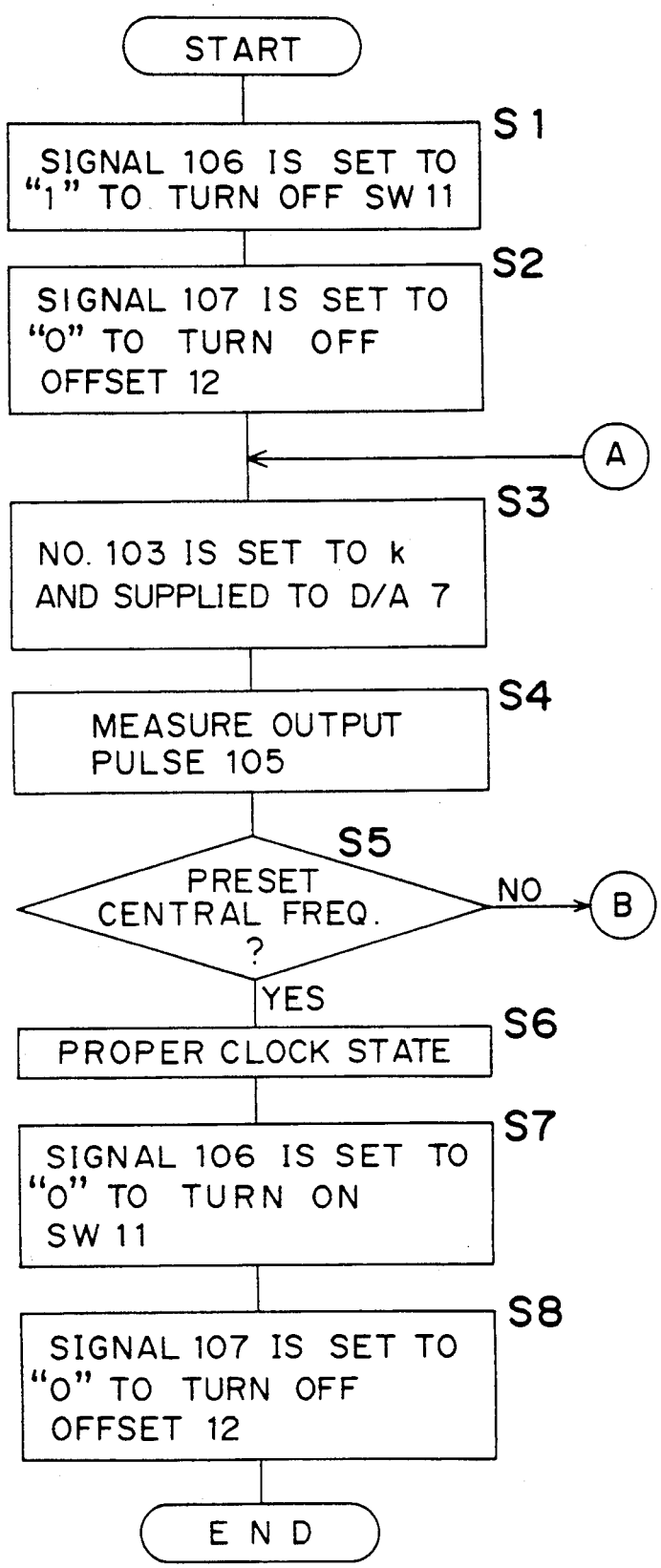
FIGS. 11(a) and 11(b), 12 and 13 are flow charts showing operation of the clock changeover apparatus of FIG. 10.
Figure 11B:
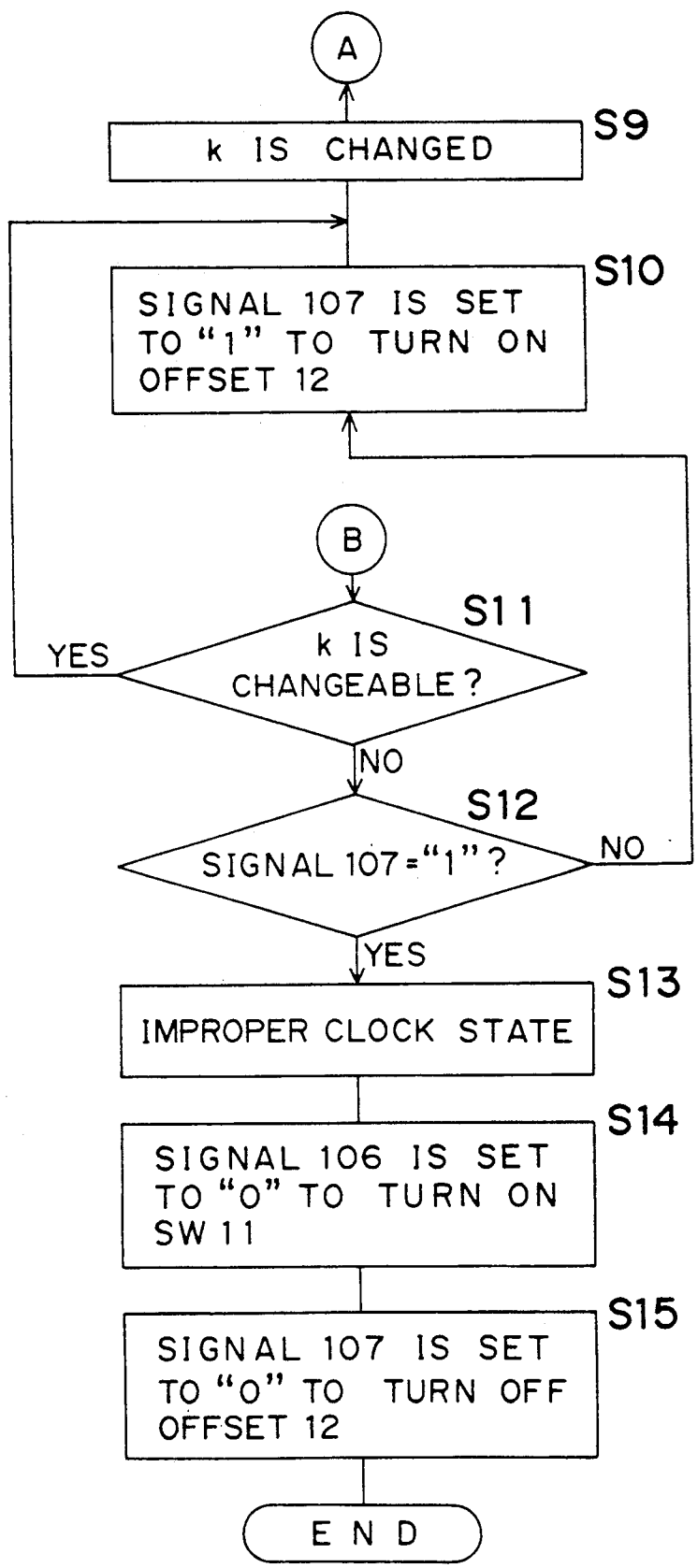

(A) In FIGS. 11(a) and 11(b), the CPU 9 sets the switching signal 106 to "1" so as to turn off the switch 11 at step S1. At step S2, the boost signal 107 is set to "0" so as to turn off the offset 12. Then, at step S3, the CPU 9 sets the central frequency 103 to k so as to supply the central frequency 103 to the digital-to-analog converter 7. The digital-to-analog converter 7 converts the central frequency k into a voltage. This voltage is applied, through the resistor ladder network 8, to the VCO 5 as the initial voltage. The VCO 5 generates an output clock having a frequency corresponding to the initial voltage and applies the output clock to the comparative frequency comparator 6. The comparative frequency divider 6 divides the output clock by M. Since the switch 11 is in the OFF state so as to obtain the open loop, the phase comparator 3 determines that phase of the output signal of the reference frequency divider 2 is the same as that of the output signal of the comparative frequency divider 6 and voltage of the phase comparator 3 assumes zero. In order to fetch the output voltage of the phase comparator 3 as DC, the output voltage of the phase comparator 3 is passed through the LPF 4. The output voltage of the LPF 4 is inputted to the VCO 5 and thus, the VCO 5 controls the oscillation frequency (output clock) on the basis of the initial voltage and the output voltage of the LPF 4. Since the output voltage of the LPF 4 is zero, the output clock becomes the central frequency itself.

At step S4, the CPU 9 measures the output pulse 105 so as to obtain the central frequency. As step S5, it is judged whether or not the central frequency is the preset central frequency. In the case of "YES" at step S5, the proper clock state is confirmed at step S6 in which the circuit is functioning properly. In this case, the CPU 9 sets the switching signal 106 to "0" so as to turn on the switch 11 at step S7 and the boost signal 107 is set to "0" so as to turn off the off offset 12 at step S8.

On the other hand, in the case of "NO" at step S5, it is judged at step S11 whether or not the central frequency k can be changed. In the case of "YES" at step S11, the central frequency k is changed at step S9 and the program flow returns to step S3.

In the case of "NO" at step S11, it is judged at step S12 whether or not the boost signal 107 is "1". In the case of "NO" at step S12, the boost signal 107 is set to "1" so as to turn on the offset 12 at step S10 followed by step S9 and the program flow returns to step S3. On the other hand, in the case of "YES" at step S12, the improper clock state is confirmed at step S13 in which the circuit is not functioning properly. In this case, the CPU 9 sets the switching signal 106 to "0" so as to turn on the switch 11 at step S14 and the boost signal 107 is set to "0" so as to turn off the offset 12 at step S15.

Figure 12:
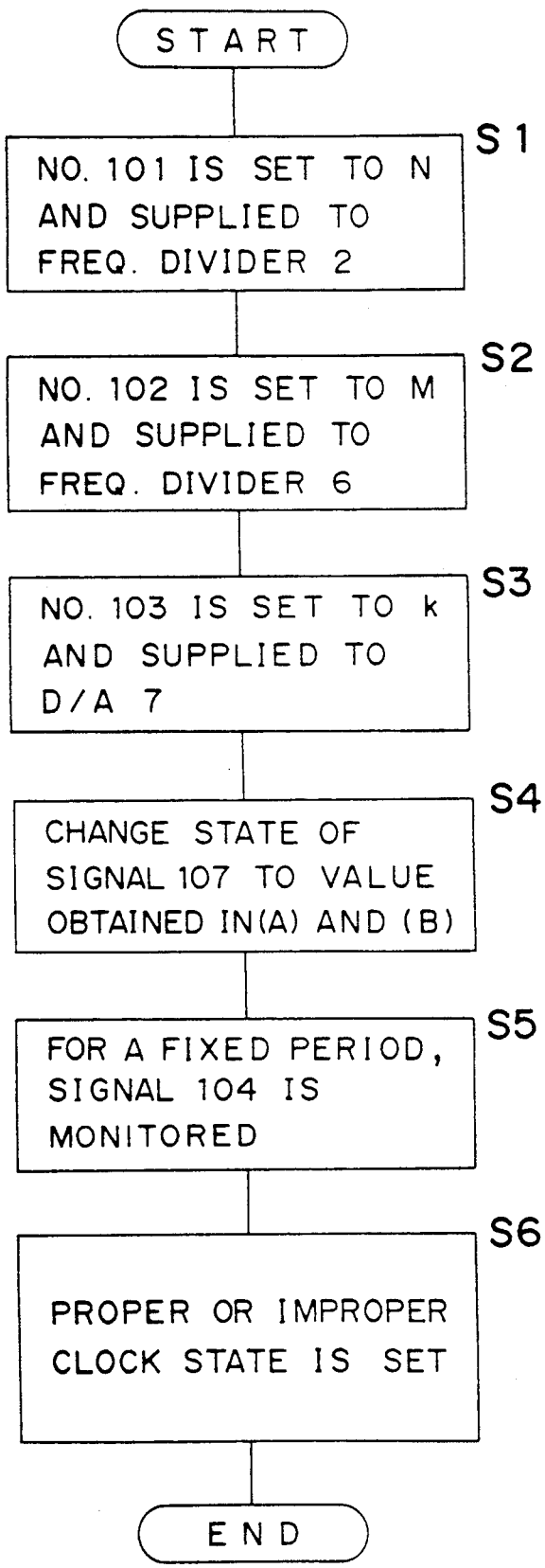
Figure 13:
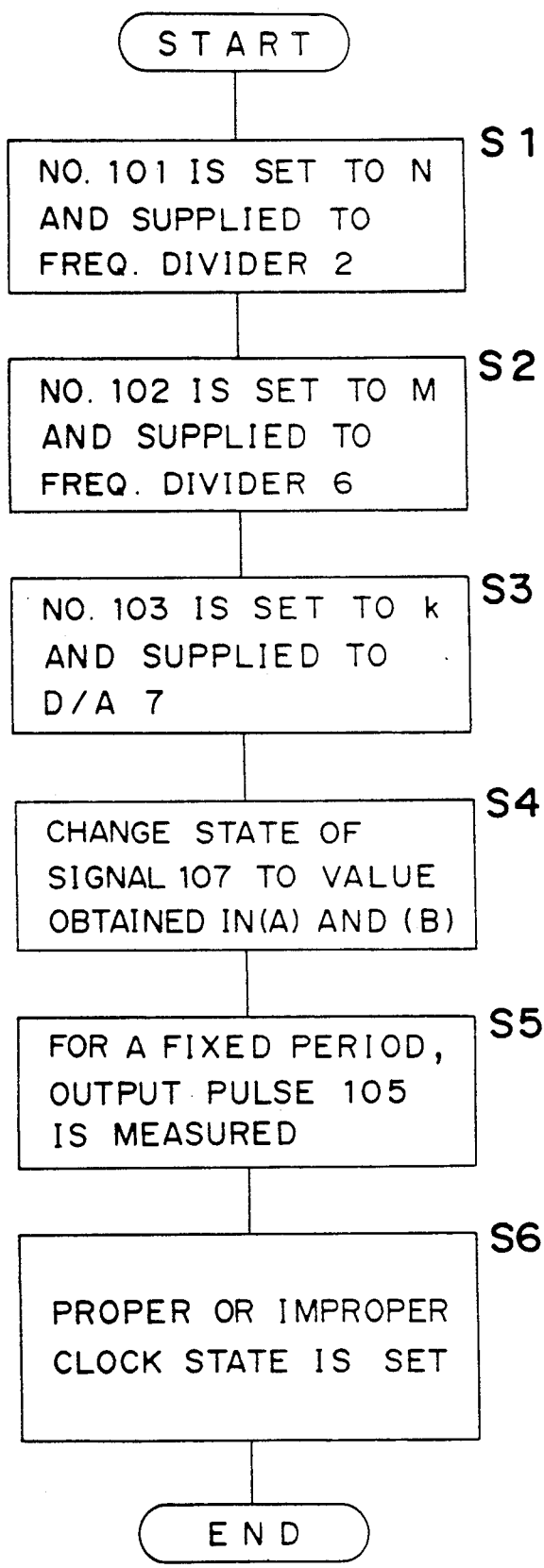
Figure 14:
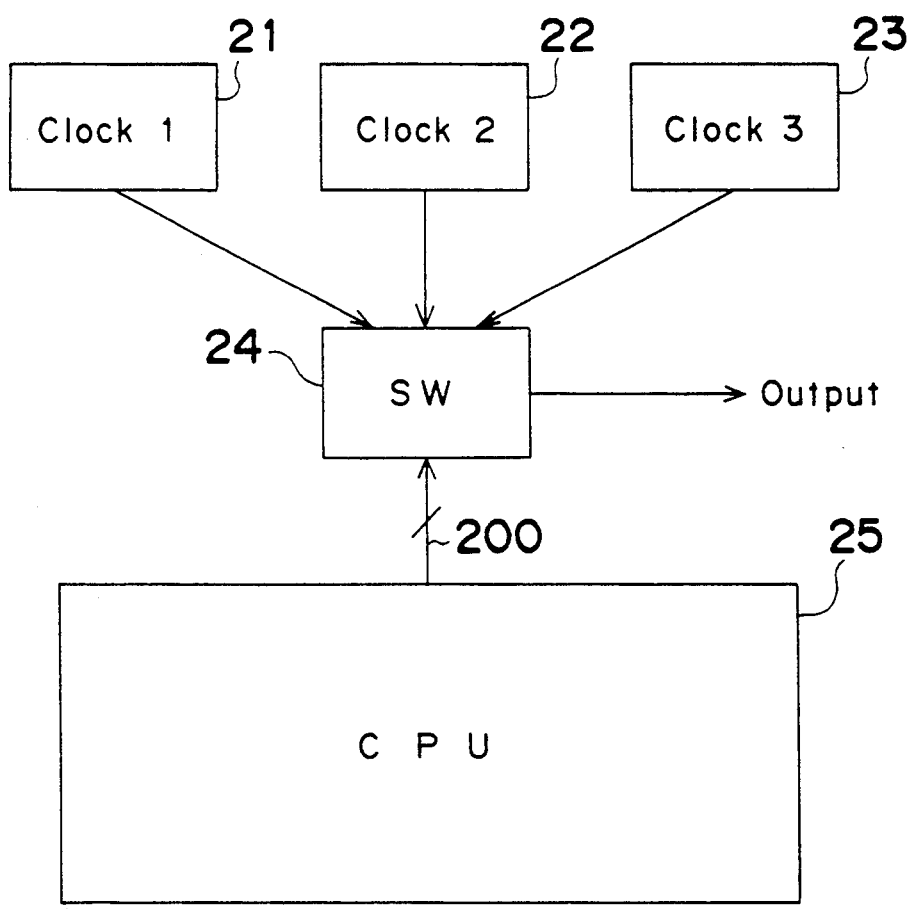
FIG. 14 is a block diagram of a prior art clock changeover apparatus (already referred to)
Figure 15:
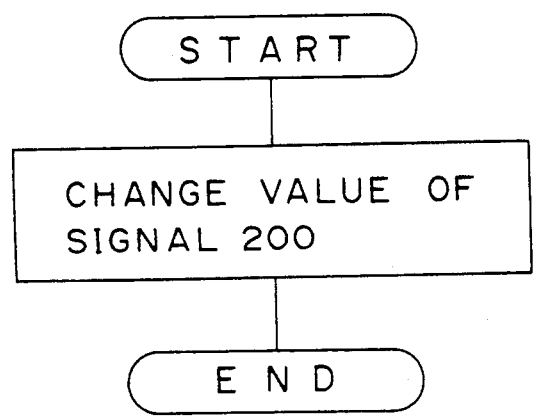
FIG. 15 is a flow chart showing operation of the prior art clock changeover apparatus of FIG. 14 (already referred to).

(B) In the same manner as in the first and second embodiments of the present invention, it is confirmed based on the central frequency k and the state of the boost signal 107 obtained in above (A) as shown in FIGS. 12 and 13 whether or not the proper clock is obtained. FIGS. 12 and 13 are different from FIGS. 5 and 7 in that FIGS. 12 and 13 include processing of the boost signal 107. Since the CPU 9 sets the switching signal 106 to "0" so as to turn on the switch 11 at the final stage of above (A), the closed loop is obtained and thus, feedback is performed.

(C) Above mentioned (A) and (B) are performed for all clock signals to be changed over. In case the output clock is changed over, the reference frequency division number 101, the comparative frequency division number 102 and the central frequency 103 are required to be changed. When all the clock signals are proper, adjustments of the central frequency have been completed.

When the clock signals are changed actually, the central frequency is set as follows.

(D) In the same manner as in the first and second embodiments of the present invention, it is confirmed based on the central frequency k and the state of the boost signal 107 obtained in above (A) and (B) through steps S1 to S6, especially, steps S4 to S6 of FIG. 12 or through steps S1 to S6, especially, steps S4 to S6 of FIG. 13 whether or not the proper clock state is obtained.

As described above, the offset 12 and the boost signal 107 are provided in the fourth embodiment of the present invention. Thus, by changing the central frequency k and the boost signal 107 in accordance with scatter in characteristics of the circuit, the improper clock state can be eliminated. Since the variable frequency range of the clock signal can be changed by merely changing voltage imparted by the offset 12, the variable frequency range of the clock signal can be widened.

Meanwhile, in the third and fourth embodiments of the present invention, the switch 11 is provided immediately upstream of the phase comparator 13 but may also be provided at any location in the circuit, where not only the loop of the phase comparator 3, the LPF 4, the VCO 5, the comparative frequency divider 6 is cut but flow of the signal through the reference clock 1, the reference frequency divider 2, the phase comparator 3, the LPF 4 and the VCO 5 is cut. Furthermore, operation of the constituent elements of the loop may be stopped. Therefore, the switch 11 may be provided, for example, immediately upstream of the LPF 4 or the VCO 5. Alternatively, operation of the comparative frequency divider 6 and the reference frequency divider 2 may be stopped or the switch 11 may be provided immediately upstream of the comparative frequency divider 6 by stopping operation of the reference clock 1.

Meanwhile, in the first to fourth embodiments of the present invention, the digital-to-analog converter 7 may be formed by a transistor and a resistor. In this case, relation between the central frequency k and the voltage may be set nonlinearly.

Meanwhile, in the first to fourth embodiments of the present invention, the voltage applied to the VCO 5 is determined by the digital-to-analog converter 7 and the resistor ladder network 8 but an LPF may also be added between the digital-to-analog converter 7 and the resistor ladder network 8 so as to stabilize operation of the circuit. If the LPF is not provided, lead-in speed of the VCO 5 becomes higher and thus, VCO 5 may not be able to perform lead-in. Therefore, by providing the LPF, lead-in speed of the VCO 5 is lowered. Frequency band of the LPF is so set as to be identical with or lower than that of the closed loop.

Furthermore, in the first to fourth embodiments of the present invention, the CPU 9 may be formed by hardware.

In addition, in the second to fourth embodiments of the present invention, if operational speed of the CPU 9 is sufficiently high, high frequency can also be counted and thus, the frequency divider 10 may be eliminated.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A clock changeover apparatus comprising:
   a reference frequency divider means for dividing a reference clock by a first frequency division number;
   a comparative frequency divider means for dividing by a second frequency division number an output clock obtained by said clock changeover apparatus;
   a phase comparator means for comparing phase of a signal of said reference frequency divider means with phase of a signal of said comparative frequency divider means;
   a clock control means for changing the output clock so as to make the phase of the signal of said reference frequency divider means coincident with the phase of the signal of said comparative frequency divider means;
   a clock determining means which gives an initial value of the output clock to said clock control means and is capable of selecting the initial value of the output clock arbitrarily;
   a changeover means for effecting changeover of the first and second frequency division numbers; and
   a phase lock detecting means for monitoring whether or not the phase of the signal of said reference frequency divider means coincides with the phase of the signal of said comparative frequency divider means.

2. A clock changeover apparatus comprising:
   a reference frequency divider means for dividing a reference clock by a first frequency division number;
   a comparative frequency divider means for dividing by a second frequency division number an output clock obtained by said clock changeover apparatus;
   a phase comparator means for comparing phase of a signal of said reference frequency divider means with phase of a signal of said comparative frequency divider means;
   a clock control means for changing the output clock so as to make the phase of the signal of said reference frequency divider means coincident with the phase of the signal of said comparative frequency divider means;
   a clock determining means which gives an initial value of the output clock to said clock control means and is capable of selecting the initial value of the output clock arbitrarily;
   a changeover means for effecting changeover of the first and second frequency division numbers; and
   an output clock measuring means for measuring frequency of the output clock.

3. A clock changeover apparatus as claimed in claim 1, further including an output clock measuring means for measuring frequency of the output clock.

4. A clock changeover apparatus as claimed in claim 3, further including a first stop means for stopping operation of said reference clock and said comparative frequency divider means.

5. A clock changeover apparatus as claimed in claim 3, further including a second stop means for stopping operation of said reference frequency divider means and said comparative frequency divider means.

6. A clock changeover apparatus as claimed in claim 3, further including a third stop means for stopping operation of said phase comparator means.

7. A clock changeover apparatus as claimed in claim 3, further including a fourth stop means for stopping operation of said clock control means.

8. A clock changeover apparatus as claimed in claim 4, further including an initial value changing means which displaces the initial value of the output clock relatively by giving an offset without changing a changeover range of said clock determining means so as to change the changeover range of said clock determining means.

9. A clock changeover apparatus as claimed in claim 5, further including an initial value changing means which displaces the initial value of the output clock relatively by giving an offset without changing a changeover range of said clock determining means so as to change the changeover range of said clock determining means.

10. A clock changeover apparatus as claimed in claim 6, further including an initial value changing means which displaces the initial value of the output clock relatively by giving an offset without changing a changeover range of said clock determining means so as to change the changeover range of said clock determining means.

11. A clock changeover apparatus as claimed in claim 7, further including an initial value changing means which displaces the initial value of the output clock relatively by giving an offset without changing a changeover range of said clock determining means so as to change the changeover range of said clock determining means.

* * * * *